United States Patent
Georgeson et al.

(10) Patent No.: US 11,255,825 B2
(45) Date of Patent: Feb. 22, 2022

(54) WRINKLE CHARACTERIZATION AND PERFORMANCE PREDICTION FOR COMPOSITE STRUCTURES

(71) Applicant: The Boeing Company, Chicago, IL (US)

(72) Inventors: Gary E. Georgeson, Tacoma, WA (US); Jill P. Bingham, Seattle, WA (US); Hong Hue Tat, Redmond, WA (US); Yuan-Jye Wu, Issaquah, WA (US); John M. Pryor, Lake Forest Park, WA (US); Sadie L. Fieni, Charleston, SC (US); Mark D. Winters, Maple Valley, WA (US); Kathryn T. Moore, Los Alamitos, CA (US); James C. Kennedy, Renton, WA (US); Clayton M. Little, Mount Pleasant, SC (US); John Z. Lin, Renton, WA (US)

(73) Assignee: The Boeing Company, Chicago, IL (US)

( * ) Notice: Subject to any disclaimer, the term of this patent is extended or adjusted under 35 U.S.C. 154(b) by 451 days.

(21) Appl. No.: 15/339,114

(22) Filed: Oct. 31, 2016

(65) Prior Publication Data

US 2018/0120268 A1 May 3, 2018

(51) Int. Cl.
*G01N 29/30* (2006.01)
*G01N 29/06* (2006.01)
(Continued)

(52) U.S. Cl.
CPC .............. *G01N 29/30* (2013.01); *G01N 21/88* (2013.01); *G01N 29/043* (2013.01);
(Continued)

(58) Field of Classification Search
CPC ................... G01N 29/30; G01N 21/88; G01N 2021/8472; G01N 2291/2632; G01N 2291/2694; G06F 17/5018
See application file for complete search history.

(56) References Cited

U.S. PATENT DOCUMENTS 6,301,512 B1 10/2001 Motzer
6,751,342 B2 6/2004 Shepard
(Continued)

FOREIGN PATENT DOCUMENTS

EP 1873519 A2 1/2008
EP 1873519 A2 2/2008
(Continued)

OTHER PUBLICATIONS

Joyce, A Technique for Characterizing Process-Induced Fiber Waviness in Unidirectional Composite Laminates—Using Optical Microscopy, Dec. 1995, (Year: 1995).*
(Continued)

*Primary Examiner* — Eric S. McCall
*Assistant Examiner* — Timothy P Graves
(74) *Attorney, Agent, or Firm* — Ostrager Chong Flaherty & Broitman P.C.

(57) ABSTRACT

Methods that provide wrinkle characterization and performance prediction for wrinkled composite structures using automated structural analysis. In accordance with some embodiments, the method combines the use of B-scan ultrasound data, automated optical measurement of wrinkles and geometry of cross-sections, and finite element analysis of wrinkled composite structure to provide the ability to assess the actual significance of a detected wrinkle relative to the intended performance of the structure. The disclosed method uses an ultrasonic inspection system that has been calibrated by correlating ultrasonic B-scan data acquired (Continued)

from reference standards with measurements of optical cross sections (e.g., micrographs) of those reference standards.

20 Claims, 8 Drawing Sheets

(51) Int. Cl.

| | |
|---|---|
| *G01N 21/88* | (2006.01) |
| *G01N 29/04* | (2006.01) |
| *G01N 29/11* | (2006.01) |
| *G01N 29/44* | (2006.01) |
| *G06F 30/23* | (2020.01) |
| *G01N 29/07* | (2006.01) |
| *G01N 21/84* | (2006.01) |

(52) U.S. Cl.
CPC ......... *G01N 29/0645* (2013.01); *G01N 29/07* (2013.01); *G01N 29/11* (2013.01); *G01N 29/4445* (2013.01); *G06F 30/23* (2020.01); *G01N 2021/8472* (2013.01); *G01N 2291/011* (2013.01); *G01N 2291/015* (2013.01); *G01N 2291/0231* (2013.01); *G01N 2291/0289* (2013.01); *G01N 2291/044* (2013.01); *G01N 2291/051* (2013.01); *G01N 2291/106* (2013.01); *G01N 2291/2632* (2013.01); *G01N 2291/2694* (2013.01)

(56) References Cited

U.S. PATENT DOCUMENTS

| | | |
|---|---|---|
| 7,075,084 B2 | 7/2006 | Thompson et al. |
| 7,119,338 B2 | 10/2006 | Thompson et al. |
| 7,186,981 B2 | 3/2007 | Shepard et al. |
| 7,287,902 B2 | 10/2007 | Safai et al. |
| 7,584,062 B1 | 9/2009 | Tat et al. |
| 7,617,730 B2 | 11/2009 | Georgeson |
| 7,699,521 B2 | 4/2010 | Shepard |
| 7,724,925 B2 | 5/2010 | Shepard |
| 8,338,787 B1 | 12/2012 | Shelley, Jr. et al. |
| 8,449,176 B2 | 5/2013 | Shepard |
| 8,499,632 B1 | 8/2013 | Ihn et al. |
| 8,853,634 B2 | 10/2014 | Shelley, Jr. et al. |
| 8,965,100 B2 | 2/2015 | Lin et al. |
| 8,981,771 B2 | 3/2015 | Thompson |
| 9,519,844 B1 | 12/2016 | Thompson et al. |
| 2008/0000299 A1* | 1/2008 | Georgeson ......... G01N 29/0645 73/606 |
| 2010/0250148 A1* | 9/2010 | Meredith ............ G01M 5/0033 702/34 |
| 2012/0219034 A1 | 8/2012 | Nielson |
| 2013/0188858 A1 | 7/2013 | Lin et al. |
| 2014/0333758 A1 | 11/2014 | Wu et al. |
| 2016/0221048 A1 | 12/2016 | Thompson et al. |

FOREIGN PATENT DOCUMENTS

| | | | |
|---|---|---|---|
| EP | 2472254 A2 * | 7/2012 | ............ G01N 29/07 |
| FR | 2930344 A1 | 10/2009 | |
| GB | 2502257 A | 11/2013 | |
| WO | 2013171228 A1 | 11/2013 | |

OTHER PUBLICATIONS

NDT Resource Center Data Presentatoin, https://www.nde-ed.org/EducationResources/CommunityCollege/Ultrasonics/EquipmentTrans/DataPres.htm, 2016 (Year: 2016).*
Extended European Search Report dated Jan. 29, 2018, in European Patent Application No. 17196313.5 (European counterpart of the instant patent application).
Kinra et al., "Ultrasonic Ply-by-Ply Detection of Matrix Cracks in Laminated Composites", J. Nondestructive Evaluation, vol. 25, No. 1, May 16, 2006, pp. 37-49.
Canadian Office Action dated Oct. 2, 2018 in Canadian Patent Application No. 2,904,559 (Canadian counterpart of the parent of the instant divisional application).
Written Opinion and Search Report from Intellectual Property Office of Singapore dated Jun. 14, 2018 in Singapore Patent Application No. 10201707048T (Singapore counterpart of the instant patent application).
Atul Shridatta Ganpatye, "Ultrasonic Ply-By-Ply Detection of Matrix Cracks in Laminated Composites", M.S. Thesis, Texas A&M University, Dec. 2004.
European Examination Report dated Mar. 6, 2019, in European Patent Application No. 17196313.5 (European counterpart of the instant patent application).
European Examination Report dated Nov. 18, 2019, in European Patent Application No. 17196313.5 (European counterpart of the instant patent application).
Karpelson, "Flaw Detection and Characterization Using Ultrasound", NDT.net, Dec. 1, 2016, pp. 1-39.
Canadian Office Action dated Sep. 3, 2021, in Canadian Patent Application No. 2,977,148 (Canadian counterpart of the instant U.S. patent application).
European Examination Communication dated Nov. 23, 2020, in European Patent Application No. 17196313.5 (European counterpart of the instant patent application).
Canadian Office Action dated Oct. 28, 2020, in Canadian Patent Application No. 2,977,148 (Canadian counterpart of the instant U.S. patent application).
Chinese Office Action dated Jun. 3, 2021, in Chinese Patent Application No. 2017107626452 (Chinese counterpart of the instant U.S. patent application).
Japanese Office Action dated Sep. 28, 2021, in Japanese Patent Application No. 2017-172745 (Japanese counterpart of the instant U.S patent application).

* cited by examiner

WRINKLE CHARACTERIZATION AND PERFORMANCE PREDICTION FOR COMPOSITE STRUCTURES

BACKGROUND

This disclosure generally relates to non-destructive inspection of structures or parts, and more particularly to systems and methods for characterizing or evaluating anomalies, such as wrinkles, in a laminate structure, such as a composite structure or similar structure.

New, lightweight composite materials and designs are being used more extensively in the aerospace industry for commercial aircraft and other aerospace vehicles, as well as in other industries. The structures using these composite materials may be formed using multiple plies or layers of fiber-reinforced plastic material that may be laminated together to form a lightweight, high-strength structure. Fabrication of composite laminate structure for aerospace applications can result in unwanted out-of-plane wrinkling of plies that can impact performance of the structure based on the size of the wrinkle. Wrinkles in composite structures and repairs may degrade their performance. Quality assurance and certification for production parts in industries such as the aircraft industry requires that the part be built to meet certain design standards and specifications. For some parts there may be a standard acceptance criteria based on wrinkle size. Accordingly being able to accurately detect and measure the size of any wrinkles in a structure or part is desirable.

Visual inspection of the surface of a composite structure can identify wrinkles, but not measure or characterize them. Due to this inability to quantify characteristics of a wrinkle, in an abundance of caution the worst case may be assumed unless means for measuring the size of the wrinkle (often in terms of length L divided by height D) can be provided. Also, wrinkles deeper in the structure cannot be seen visually from the surface at all.

Sub-surface wrinkles can be identified using ultrasonic inspection techniques. However, wrinkles detected ultrasonically are typically quantified by means for destructive sectioning and polishing the composite material, capturing an image (i.e., micrograph) of the cross section of the composite material using a microscope, and examining the micrographs collected at the wrinkle location. This causes time-consuming and costly work that may have been unnecessary. For example, during a program's part development activity (pre-production manufacturing and pre-production verification), many cut-ups, polishing, and wrinkle measurements are done that are very costly.

There is a need for methods for non-destructively characterizing a wrinkle in composite material and then determining the significance of the detected characteristics relative to the intended performance using automated structural analysis.

SUMMARY

The subject matter disclosed herein is directed to methods that provide wrinkle characterization and performance prediction for wrinkled composite structures during manufacturing or repair. More specifically, methods for non-destructively characterizing a wrinkle in composite material and then determining the significance of the detected characteristics relative to the intended performance using automated structural analysis are disclosed.

In accordance with some embodiments, the method combines the use of B-scan ultrasound data, automated optical measurement of wrinkles and geometry of cross-sections, and finite element analysis (FEA) of wrinkled composite structure to provide the ability to assess the actual significance of a detected wrinkle relative to the intended performance of the structure. The result is the saving of the time and cost of sectioning or repair in many cases, and validation of use of the structure or repair based on engineering data.

In accordance with one embodiment, a method for characterizing wrinkles in a composite structure and then predicting the performance of the wrinkled composite structure based on those wrinkle characterizations uses an ultrasonic inspection system that was calibrated by correlating ultrasonic B-scan data with measurements of optical cross sections (e.g., micrographs) of reference standards. This has the benefit that ultrasonic B-scan data collected from original or repaired composite structures in production or in service (i.e., not reference standards) can be used to characterize wrinkles in the composite structure without the necessity of destroying that composite structure to obtain optical cross sections. In other words, the wrinkle characterization obtainable from an optical cross section can be inferred from the results of the B-scan without cutting the inspected part to obtain an optical cross section. More specifically, the B-scan data can be converted into a wrinkle profile characterization without the necessity of making optical cross section measurements due to the pre-calibration procedure which correlated B-scan data to optical cross-section measurement data.

One aspect of the subject matter disclosed in detail below is a method for calibrating an ultrasonic inspection system, comprising: (a) forming a multiplicity of reference standards made of composite material, each reference standard having at least one wrinkle; (b) collecting ultrasonic B-scan data from the multiplicity of reference standards using an ultrasonic inspection system; (c) cutting the reference standards to expose cross sections; (d) imaging the exposed cross sections to produce optical cross sections; (e) measuring features of the at least one wrinkle of each reference standard which appear in the optical cross sections to acquire optical cross-section measurement data; and (f) correlating the ultrasonic B-scan data with the optical cross-section measurement data. The optical cross-section measurement data comprises data representing wavelengths and maximum depths of wrinkles in respective reference standards.

Another aspect of the subject matter disclosed in detail below is an ultrasonic imaging system having a B-scanning mode in which time and depth axes ranges and time-gate settings for a B-scan window are based on a correlation of ultrasonic B-scan data with optical cross-section measurement data.

A further aspect of the subject matter disclosed in detail below is a method for non-destructive inspection of composite structures, comprising: (a) calibrating an ultrasonic inspection system based on correlation of ultrasonic B-scan data and optical cross-section measurement data acquired from reference standards made of composite material, each reference standard having at least one wrinkle; (b) collecting non-destructive inspection data from a part made of composite material using the ultrasonic inspection system after completion of step (a); (c) detecting the presence of a wrinkle in the part based on the non-destructive inspection data collected in step (b); (d) collecting ultrasonic B-scan data from the part using the ultrasonic inspection system; and (e) measuring dimensions of the wrinkle in the part based on the ultrasonic B-scan data collected in step (d). In accordance with some embodiments, the non-destructive inspection data is collected in step (b) using at least one of the following: an ultrasound technique, infrared thermography, an X-ray backscatter technique, X-ray computed tomography or X-ray laminography.

Yet another aspect of the subject matter disclosed in detail below is a method for non-destructive inspection of composite structures, comprising: (a) calibrating an ultrasonic inspection system based on correlation of ultrasonic B-scan data and optical cross-section measurement data acquired from reference standards made of composite material, each reference standard having at least one wrinkle; (b) collecting ultrasonic B-scan data from a part made of composite material using the ultrasonic inspection system after completion of step (a); (c) detecting the presence of a wrinkle in the part based on the ultrasonic B-scan data collected in step (b); and (d) measuring dimensions of the wrinkle in the part based on the ultrasonic B-scan data collected in step (b).

A further aspect of the subject matter disclosed in detail below is a method for predicting performance of a wrinkled composite structure, comprising: (a) calibrating an ultrasonic inspection system based on correlation of ultrasonic B-scan data and optical cross-section measurement data acquired from reference standards made of composite material, each reference standard having at least one wrinkle; (b) collecting ultrasonic B-scan data from a wrinkled composite structure using the ultrasonic inspection system after completion of step (a); (c) measuring dimensions of a wrinkle in the wrinkled composite structure based on the ultrasonic B-scan data collected in step (b) to obtain wrinkle feature measurements; (d) generating a structural model of the wrinkled composite structure based on the wrinkle feature measurements obtained in step (c); and (e) performing a structural analysis of the structural model. This method may further comprise determining whether the part should be rejected or not based on results of the structural analysis.

Other aspects of methods for characterizing wrinkles in composite structures and predicting performance of wrinkled composite structures are disclosed below.

BRIEF DESCRIPTION OF THE DRAWINGS

The features, functions and advantages discussed in the preceding section can be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

For the purpose of illustration, systems and methods for non-destructive inspection of structures made of composite material (e.g., a composite laminate made of fiber-reinforced plastic) that enable identification and quantification of wrinkles in composite structures and prediction of performance will now be described in detail. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The methods disclosed in detail below provide wrinkle characterization and performance prediction for composite structures during manufacturing or repair. In accordance with some embodiments, the method combines the use of B-scan ultrasound data, automated optical measurement of wrinkles and geometry of cross sections, and finite element analysis (FEA) of wrinkled composite structure to provide the ability to assess the actual significance of a detected wrinkle relative to the intended performance of the structure. To enable a person skilled in the art to better understand the context of the innovations disclosed herein, a thorough explanation of ultrasonic inspection techniques using calibrated ultrasonic inspection devices will now be described with reference to FIGS. 1-4.

Figure 1:
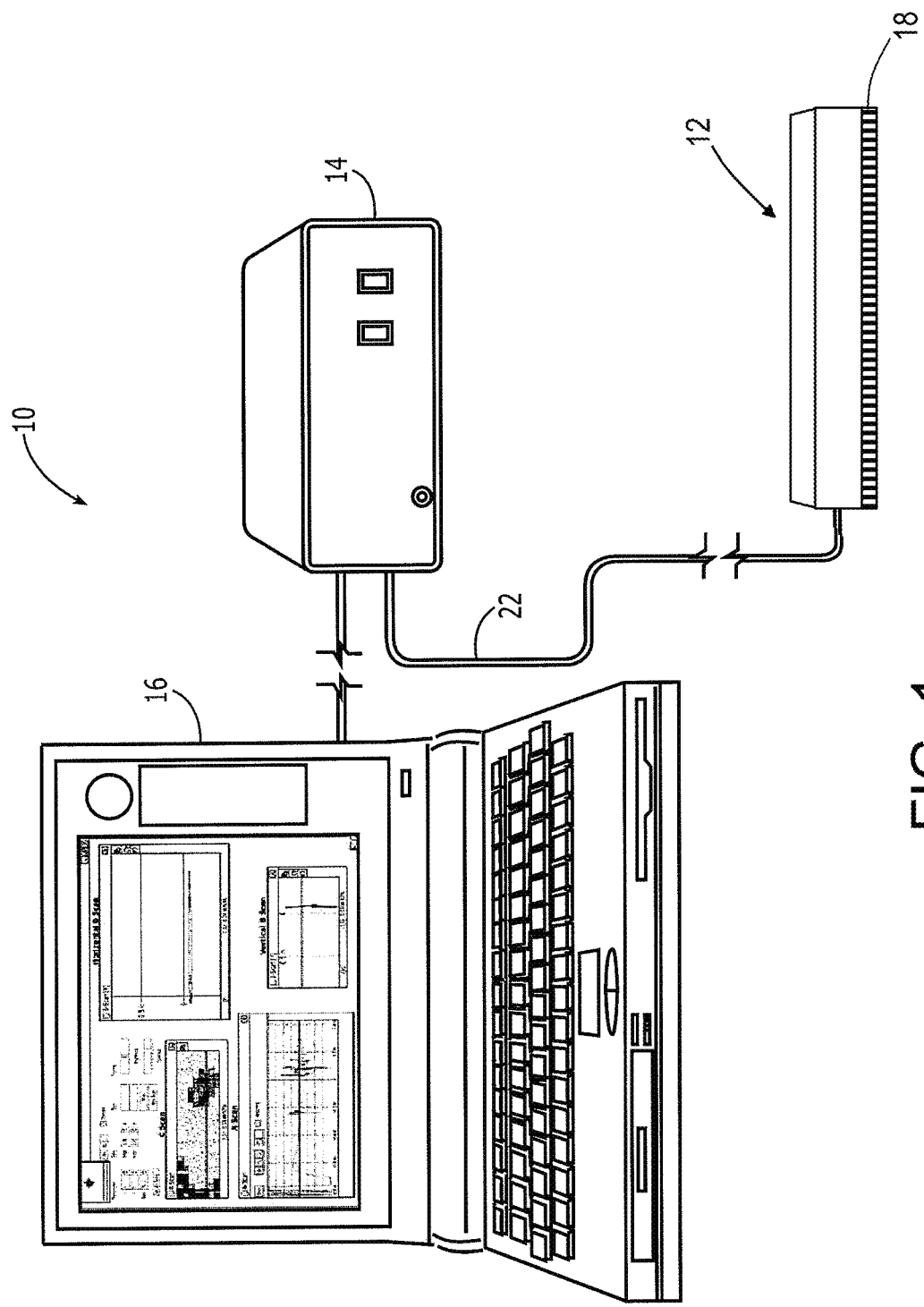
FIG. 1 is a front view of an ultrasonic inspection system, which includes a flexible transducer array, by which an aircraft structure may be non-destructively inspected.

FIG. 1 shows components of an exemplary system for ultrasonic inspection of composite structures, such as aircraft structural elements or components. The ultrasonic inspection system 10 includes a linear ultrasonic transducer array 12, an array controller 14 (e.g., a pulser/receiver unit), and a computing and display device 16. The linear ultrasonic transducer array 12 comprises a row of ultrasonic transducers 18 spaced with constant pitch. In alternative embodiments, the ultrasonic transducer array may be a flexible two-dimensional array of ultrasonic transducers. In a pulse-echo mode, each ultrasonic transducer both sends and receives ultrasonic waves.

In a pulse-echo ultrasound apparatus, a high-frequency sound wave generated by an ultrasonic transducer 18 enters an inspected structure (not shown in FIG. 1) at the location of interest. As the ultrasound wave passes through the thickness of the inspected structure, the ultrasound wave comes into contact with any areas of discontinuity located in the path of the beam. Such discontinuities could include a void or area of resin porosity, a delamination, a wrinkle, foreign matter, or a change in stiffness caused by a composite ply formed of a different material, etc. When the ultrasound wave impinges on discontinuity, a portion of the sound energy is reflected back through the part toward the ultrasonic transducer 18.

Each ultrasonic transducer 18 is gated to act as both a transmitter that produces ultrasound wave pulses and as a receiver that records the returned ultrasound waves. The time between when a pulse is transmitted and a return signal is received equals the time it took for the ultrasound wave to pass into the inspected structure, impinge on the discontinuity, and travel back to the ultrasonic transducer 18. Thus, the time between transmission and reception is related to the depth of the discontinuity. The amplitude of the return signal is related to the magnitude of the discontinuity, as the larger the discontinuity, the more ultrasound energy will be reflected back towards the ultrasonic transducer 18.

The ultrasonic transducer array 12 is in electronic communication with the array controller 14 by way of a cable 22. In the alternative, means for wireless communications may be provided. The array controller 14 energizes each ultrasonic transducer 18 to send an ultrasonic pulse into the inspected structure and then receives an electrical signal generated by the ultrasonic transducer 18 when an ultrasonic echo signal returns from the inspected structure. A returning ultrasonic echo signal can include multiple time-distributed echo pulses reflected from surfaces and edges that are expected and from damage that deserves investigation and repair. The electrical signal generated by the ultrasonic transducer 18 conveys amplitude and time data corresponding to the amplitudes and arrival times of echo pulses within the ultrasonic echo signal. The amplitude and time data can be used to discriminate damage-related echo pulses from echo pulses reflected from undamaged features of a structure. In accordance with one inspection scheme, after the array controller 14 energizes an ultrasonic transducer 18 and collects amplitude and time data therefrom, a brief period of quiescence then passes before the controller energizes another transducer. By maintaining pulse-echo operations of each ultrasonic transducer 18 separate in time from operations of other transducers, cross-talk among the transducers is avoided and the data collected from each transducer can be associated with each transducer location. Thus, when the ultrasonic transducer array 12 is disposed against a structure, the data collected from the transducers can be associated with localized properties of the structure at the respective transducer locations.

The computing and display device 16 receives the collected amplitude and time data from the array controller 14 and graphically displays the data on a display screen for interpretation by a user toward identifying damages in an inspected structure. For example, in FIG. 2 the display screen displays simulated data from a transducer array. In particular, FIG. 2 displays a simulated waveform plot from a particular transducer in an A-scan window 24, a simulated cross-section depth image from a vertically disposed linear ultrasonic transducer array in a vertical B-scan window 26, a simulated cross-section depth image from a horizontally disposed linear ultrasonic transducer array in a horizontal B-scan window 28, and a simulated echo-amplitude image constructed during linear movement of linear ultrasonic transducer array over the surface of the inspected structure in a C-scan window 30.

Figure 2:
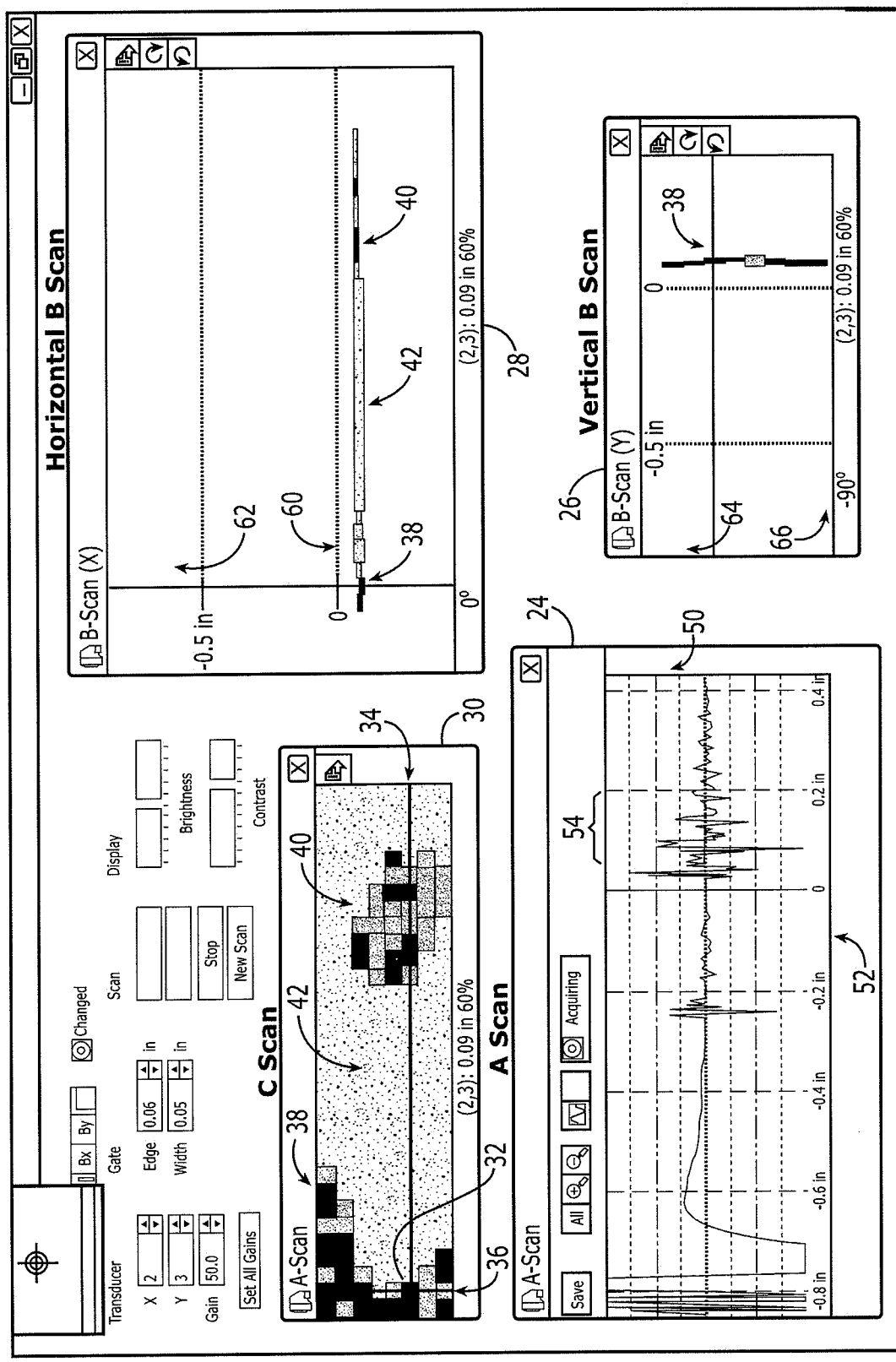
FIG. 2 shows simulated A-scan, B-scan, and C-scan windows displaying simulated time and amplitude data related to inspecting a structure.

The A-scan, B-scan, and C-scan images in FIG. 2 are simulated images in the sense that simulated data is graphically displayed in order to represent real data collected by a real transducer array. While some of these images are based at least in part on real data, they should be viewed as illustrations fabricated and provided to support understanding of the technology underlying the innovations disclosed in detail below. Further statements toward the simulated nature of these images are not present in the following descriptions for the sake of brevity. Nonetheless, all A-scan, B-scan, and C-scan images described herein should be understood as simulated images.

The simulated data shown in the displays of FIG. 2 represent real data generated using a linear ultrasonic transducer array having at least 32 transducers disposed in a single row that has been incrementally and periodically moved so that data is acquired at eight equally spaced successive positions. A cross-hair cursor 32 is disposed at a particular pixel arranged along a pixel row 34 and along a pixel column 36. Thus, the pixel under the cross-hair cursor 32 corresponds to a particular location on the surface of an inspected structure, and the C-scan window 30 displays an image of an area of a structure inspected by the linear ultrasonic transducer array across the area. The C-scan image includes images of damaged portions 38 and 40 of the inspected structure as distinguished by pixel colorations (not shown in the simulated images shown in FIG. 2) from an undamaged background area 42 corresponding to an undamaged area of the structure. The B-scan window 28 displays a B-scan cross-sectional depth image of the damaged portions 38 and 40 as derived from data corresponding to the pixel row 34 in the C-scan image. Similarly, the B-scan window 26 displays a B-scan cross-sectional depth image of the damaged portion 38 as derived from data corresponding to the pixel column 36.

An understanding of the C-scan image FIG. 2 may be gained by considering the A-scan window 24. A particular transducer, which corresponds to the pixel under the cross-hair cursor 32 in C-scan window 30, sent an ultrasonic pulse into a structure and an ultrasonic echo signal returned to the transducer. The transducer received the echo signal and generated an electrical signal as represented by the waveform plot that represents signal amplitude on a vertical axis 50 and time on a horizontal axis 52 in the A-scan window 24. The C-scan window 30 displays an echo amplitude C-scan image in that the coloration of each pixel therein corresponds to an amplitude of a portion of an echo signal. In particular, the coloration of the pixel under the cross-hair cursor 32 in the C-scan window relates to the amplitudes of echo pulses present in a time-gated portion 54 of the waveform plot in the A-scan window. The amplitude within the time-gated portion can be derived from a smoothed and integrated function of the waveform plot according to known mathematical principles.

The B-scan window 28 in FIG. 2 displays a cross-sectional depth image (the section being along a first axis) of a portion of the structure under inspection. The image corresponds to pixel row 34 in the C-scan window 30. Transducer positions are represented along a horizontal axis 60 and the depths of echo-producing features such as damage are represented along a vertical axis 62. Each pixel within the image is colored according to the amplitude of any echo pulse received by the corresponding transducer from the corresponding depth. Depth is derived from the time of flight (TOF) measured between the dispatch of an ultrasonic pulse into a structure and the return of an echo pulse. If the speed of propagation of ultrasonic pulses is known for a particular inspected material, the vertical axis 62 can be calibrated toward particular linear depth dimensions according to the TOF of each echo pulse. The vertical axis can also be empirically calibrated using a material sample having a calibrated depth.

As previously noted, the B-scan image in the B-scan window 28 represents a cross-sectional view of the inspected structure. Portions 38 and 40 of the B-scan image correspond to damaged portions 38 and 40 respectively displayed in the C-scan window. Between the portions 38 and 40 of the B-scan image, a B-scan image portion 42 representing undamaged structure is shown. Thus, an operator may view the echo-amplitude image in the C-scan window 30 to appreciate a plan view image of damage, and then view the cross-sectional depth image in the B-scan window 28 to appreciate the depth distribution of the damage in a cross-sectional plane within the inspected structure.

The B-scan window 26 in FIG. 2 similarly displays a cross-sectional depth image (the section being along a second axis orthogonal to the first axis) of a portion of the structure under inspection. The image data displayed in B-scan window 26 corresponds to pixel column 36 in C-scan window 30. Transducer positions are represented along a vertical axis 64 and the depths of echo-producing features such as damage are represented along a horizontal axis 66. Each pixel within the image is colored according to the amplitude of any echo pulse received by the corresponding transducer from the corresponding depth.

In FIG. 2, as an operator manipulates a user interface device such as a movable mouse device or a keypad having directional keys, the cross-hair cursor 32 is disposed at varying locations within the C-scan window 30. As the cursor is disposed at any particular pixel, the A-scan window 24 displays a waveform plot corresponding to the particular pixel. Furthermore, the B-scan windows 28 and 26 display depth images taken along mutually orthogonal cross sections. The data for the various views is generally first collected by the ultrasonic inspection system 10 (FIG. 1) and is then viewed and analyzed by an operator. Nonetheless, an operator may prompt the collection of new pulse echo data for any particular transducer or for the entire array by manipulating virtual controls available on the display screen shown in FIG. 2.

Non-destructive testing and results analysis of manufactured articles (such as aircraft) preferably includes participation by specially trained non-destructive testing inspectors. Generally the trained inspector will be called out to the inspection site for the purpose of inspecting the part. During the set-up procedure, typically the trained inspector will calibrate the non-destructive testing instrument for the area of the part to be inspected.

Figure 3:
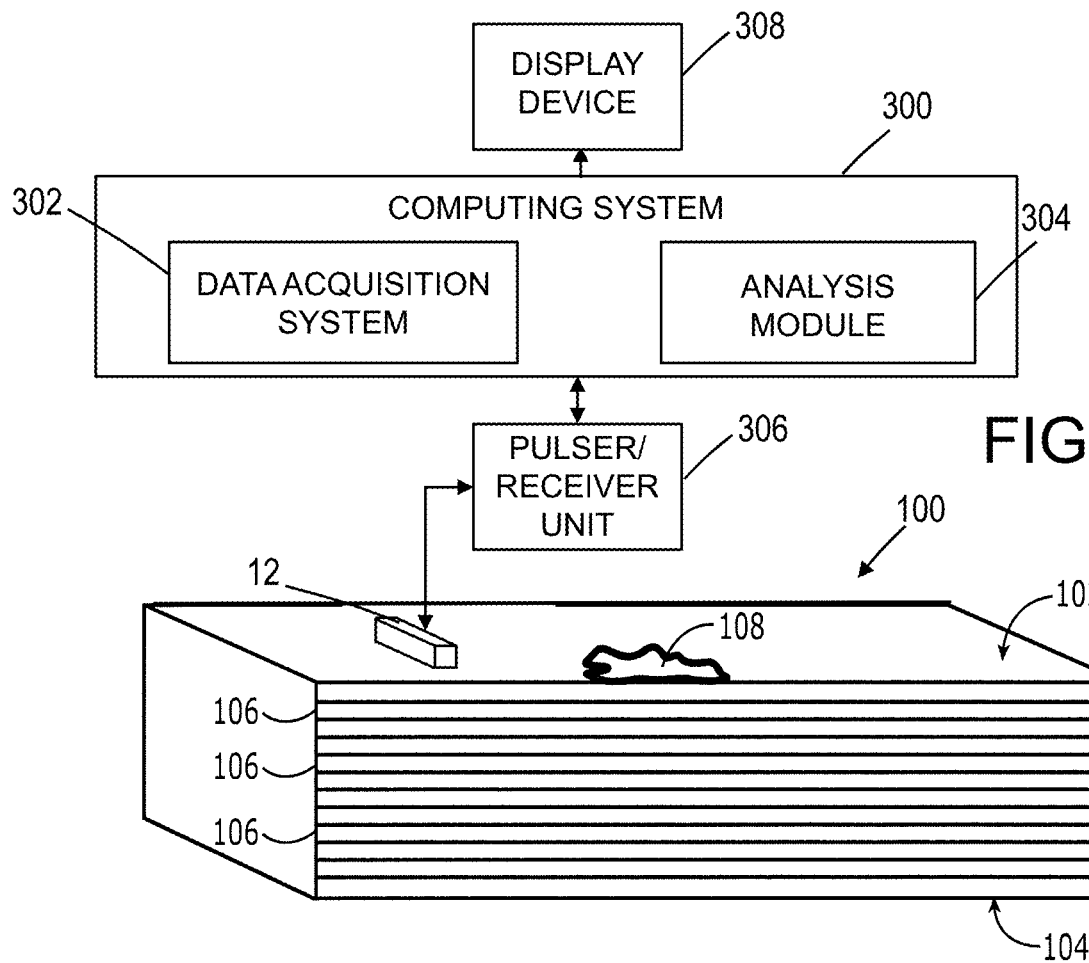
FIG. 3 is a diagram depicting a non-destructive testing instrument having an ultrasonic transducer acoustically coupled to a laminate structure to be inspected.

FIG. 3 illustrates some components of one type of non-destructive testing instrument to be calibrated. This non-destructive testing instrument (hereinafter "ultrasonic inspection system") comprises a linear ultrasonic transducer array 12 connected to a pulser/receiver unit 306 via an electrical cable (not shown). The linear ultrasonic transducer array 12 is placed on a surface 102 of an exemplary composite laminate structure 100 under inspection.

The laminate structure 100 depicted in FIG. 3 can be part of many different types of composite structure, such as those found in aircraft, automobiles and other vehicles. The composite laminate structure 100 has a front surface 102 and a back surface 104 and is composed of multiple individual plies 106. Each ply 106 may comprise fiber-reinforced plastic material. The plies 106 are joined together by resin. In the course of normal use, composite laminate materials are subject to accidental damage. In some instances the resultant damage will be small, while in other instances the damage may be moderate to severe. For example, the laminate structure 100 in FIG. 3 is depicted as being so lightly damaged that a marking visibly apparent at an impact site 108 is merely superficial and not a threat to the integrity of the structure.

A computing system 300 is operatively coupled to the pulser/receiver unit 306. The computing system 300 includes a data acquisition component/system 302 configured to acquire data from the pulser/receiver unit 306 and an analysis module 304 configured to analyze the acquired data.

In accordance with some embodiments, the data acquisition system 302 acquires data over time from the pulser/receiver unit 306 and controls the pulser/receiver unit 306. The data acquisition system 302 can acquire data that the pulser/receiver unit 306 provides as analog output and data that the pulser/receiver unit 306 provides as transistor-transistor logic output. The data acquisition system 302 can cause the acquired data to be stored or can provide access to the acquired data in real time for analysis.

In accordance with some embodiments, the analysis module 304 comprises software which is configured to organize and chart the acquired data, such as in a spreadsheet. The analysis module 304 can also analyze the acquired data for values that are indicative of failure or a flaw, such as a wrinkle, crack, delamination or disbond. In one embodiment, if the analysis module 304 detects initiation of failure, the analysis module 304 can cause the computing system 300 to generate an alert or alarm. The analysis module 304 can analyze the acquired data from the data acquisition system 302 in real time as the data acquisition system 302 acquires the data from the pulser/receiver unit 306. The analysis module 304 can also access stored data that the data acquisition system 302 has caused to be stored.

In addition, a display device 308 is operatively coupled to the computing system 300. The display device 308 can display images generated by the analysis module 304, either in real time or from stored data. The display device 308 can also display images, such as one or more B-scans, in real time from data acquired by the data acquisition system 302.

During the inspection procedure, the linear ultrasonic transducer array 12 is typically pressed against surface 102 of laminate structure 100. In a pulse-echo mode, the linear ultrasonic transducer array 12 sends ultrasonic pulses into the composite laminate structure 100 and then generates an electrical signal when an ultrasonic echo signal returns from that structure. A returning ultrasonic echo signal can include multiple time-distributed return pulses. Returning ultrasonic echo signals are referred to herein as "echo profiles". Typical echo profiles include return pulses reflected from surfaces and edges that are expected and return pulses reflected from damage that deserves investigation and repair. The electrical signal generated by the linear ultrasonic transducer array 12 conveys amplitude and time data corresponding to the amplitudes and arrival times of return pulses within the echo profile. The pulser/receiver unit 306 activates the linear ultrasonic transducer array 12 to send outgoing ultrasonic pulses and receives electrical signals generated by the ultrasonic transducer elements of the linear ultrasonic transducer array 12.

For the sake of illustration, the operation of a single element of the linear ultrasonic transducer array 12 will now be described. A single ultrasonic transducer element can be activated to emit one or more ultrasonic pulses into the laminate structure 100. After each pulse, that same ultrasonic transducer element can detect the echo profile 110 shown in FIG. 4. In the scenario depicted in FIG. 4, the single ultrasonic transducer element is disposed along the surface 102 at a location where no flaws are present in the underlying structure. Thus, the echo profile 110 detected by the ultrasonic inspection system is indicative of a defect-free structure.

Figure 4:
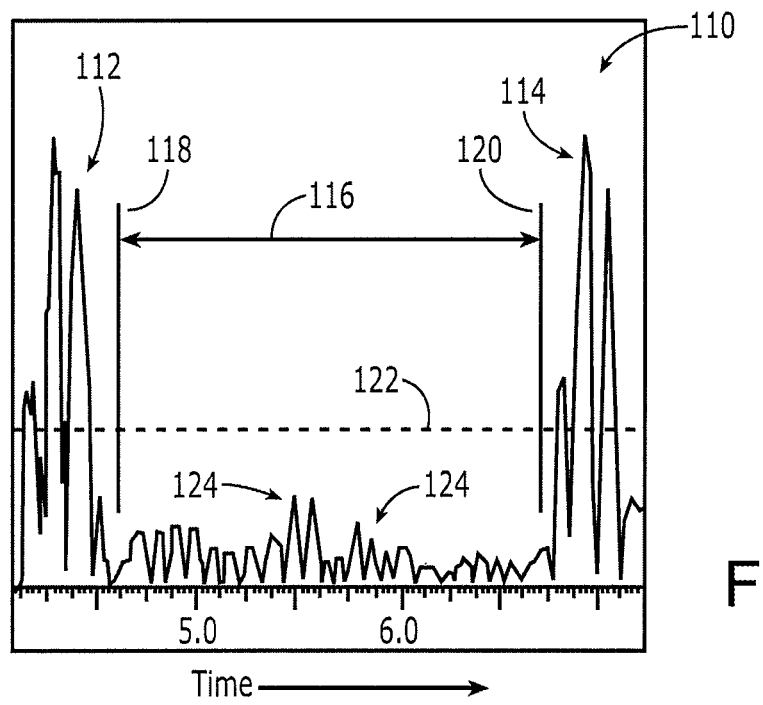
FIG. 4 is a graph of an echo profile generated by the ultrasonic transducer device depicted in FIG. 3.

The electrical waveform 110 shown in FIG. 4 represents the electrical signal generated by a single ultrasonic transducer element as graphically displayed on the display device 308 (shown in FIG. 3). Electrical fluctuations having various amplitudes rise vertically above the "Time" axis such that early fluctuation events are shown on the left and subsequent events are represented by considering the waveform from left to right. Thus the electrical signals 112 depicted in FIG. 4 are generated by the ultrasonic transducer element before the electrical signals 114. Although the groups of electrical signals 112 and 114 are composed of high-frequency oscillations, they will be referred to hereinafter as "pulses". Furthermore, the electrical waveform 110 is intended to represent multiple time-ordered ultrasonic return pulses that echo from features of the ultrasonically inspected structure. Thus, the electrical waveform 110 will be hereinafter referred to as "echo profile 110" and the electrical signals 112 and 114 will be hereinafter referred to as "return pulses 112 and 114". The echo profile 110 includes the return pulse 112 that returned from the front surface 102 of the laminated structure 100 as an echo after an outgoing ultrasonic pulse was sent toward the structure. The echo profile 110 also includes the return pulse 114 that similarly returned as an echo from the back surface 104. Outgoing pulses are not illustrated as portions of echo profiles herein but should be understood to have occurred at times preceding the front-surface return pulse in FIG. 4.

Still referring to FIG. 4, a time-gated portion 116 (indicated by a horizontal double-headed arrow) of the echo profile is disposed between a gate-initiating time 118 and a gate-closing time 120 (indicated by vertical lines). The initiating and closing times are predetermined according to a calibrating procedure discussed in more detail below. Ultrasonic waves tend to echo from structural discontinuities such as surfaces and flaws including wrinkles, delaminations, fissures, voids and contaminants. In FIG. 4, the time-gated portion 116 of the echo profile 110 is free of significant return pulses because such flaws are not present in the laminate structure 100 depicted in FIG. 3. More particularly, such flaws are not present in the portion of the laminate structure 100 under the ultrasonic transducer array 12. In order for the ultrasonic inspection system to distinguish significant return pulses that discriminate structural flaws from insignificant noise and minor fluctuations 124, a threshold 122 (indicated by a horizontal dashed line) may also be predetermined or established according to the calibrating procedure described below. In FIG. 4, no return pluses having amplitudes exceeding the threshold 122 are within the time-gated portion 116 of the echo profile 110.

The time-gate initiating and closing times 118 and 120 are established by choice to closely follow and precede front-surface and back-surface return pulses. This configuration choice for the ultrasonic inspection system depicted in FIG. 3 serves to detect return pulses, within an echo profile 110, received from between the front and back surfaces. However, depth is correlated with the time of flight (TOF) measured between the dispatch of an outgoing pulse and the receipt of a return pulse.

Thus, the initiating and closing times can be established so that the ultrasonic inspection system informs an operator of the likely presence or absence of return pulses from any chosen depth range. Any desired depth range, defined between a first depth and a second depth, can be chosen for inspection by establishing or predetermining both a gate-initiating time corresponding to the first depth and a gate-closing time corresponding to the second depth.

The ultrasonic inspection system depicted in FIG. 3 can measure thickness, depth or distance by very precisely timing echoes. In order to turn these time measurements into distance measurements, the ultrasonic inspection system is calibrated with the speed of sound in the laminate structure (or other test material) as well as any necessary zero offset. This process is commonly referred to as velocity/zero calibration. The accuracy of any ultrasonic thickness, depth or distance measurement is dependent on the accuracy of the calibration. Calibrations for different materials and transducers can be stored and retrieved.

In a typical velocity calibration, the ultrasonic inspection system measures the speed of sound in a reference sample of the test material and then stores that value for use in calculating thickness from measured time intervals. In a typical zero calibration, the ultrasonic inspection system measures a material sample of known thickness and then calculates a zero offset value that compensates for the portion of the total pulse transit time that represents factors other than the actual sound path in the test material.

For example, in a typical procedure for calibrating an ultrasonic inspection system, the following steps are performed. If the equipment includes an X-Y scanner, the inspection distance increments are set. Then the pulser frequency is set to the frequency of the transducer. If a receiver frequency can be adjusted, it is set to broadband. Then the material velocity is set. If the probe is a linear array, the following adjustments are made: set the focus distance; set the number of firing elements; set the first element to 1 and the last element to the number of elements in the array; and make sure that the linear array has a constant back surface signal from all of the elements. Then an A-scan screen range is set to no less than the maximum structure thickness in the inspection area. Next, three gates are made on the A-scan display. The three gates are an interface (i.e., front surface) gate, a second gate that monitors the depth (time-of-flight), and a third gate that monitors the height of the back surface signal. Then a reference standard may be used to set the Time-Compensated Gain (TCG). Typically the TCG is adjusted for a back surface signal of 80% (±10%) of full screen height.

The innovation disclosed in detail below is a non-destructive inspection methods that provide wrinkle characterization and performance prediction for composite structures during manufacturing or repair. In accordance with one embodiment, the method combines the use of B-scan ultrasound data, automated optical measurement of wrinkles and geometry of cross sections, and finite element analysis (FEA) of wrinkled composite structure to provide the ability to assess the actual significance of a detected wrinkle relative to the performance of the structure.

In accordance with one embodiment, a process of characterizing wrinkles in a composite structure and then predicting the performance of the wrinkled composite structure based on those wrinkle characterizations uses an ultrasonic inspection system that was calibrated by correlating ultrasonic B-scan data with measurements of optical cross sections (e.g., micrographs) of reference standards. This has the benefit that ultrasonic B-scan data collected from original or repaired composite structures in production or in service (i.e., not reference standards) can be used to characterize wrinkles (which normally cannot be characterized using B-scan data alone) in the composite structure without the necessity of destroying that composite structure to obtain optical cross sections that enable wrinkle characterization. In other words, the wrinkle characterization obtainable from an optical cross section can be inferred from the results of the B-scan without obtaining an optical cross section. More specifically, the B-scan data can be converted into a wrinkle profile characterization without the necessity of making optical cross section measurements due to the pre-calibration procedure that correlated B-scan data to optical cross-section measurement data.

An exemplary embodiment of a method for characterizing wrinkles in a composite structure and then predicting the performance of the wrinkled composite structure based on those wrinkle characterizations will now be described in some detail. However, not all features of an actual implementation are described in this specification. A person skilled in the art will appreciate that in the development of any such actual embodiment, numerous implementation-specific decisions are made to achieve the developer's specific goals, such as compliance with system-related constraints, which will vary from one implementation to another. Moreover, it will be appreciated that such a development effort might be complex and time-consuming, but would nevertheless be a routine undertaking for those of ordinary skill in the art having the benefit of this disclosure.

A current method of determining the internal part quality (when initially developing the process to make a part or to assess effects of design or process changes) is to destructively inspect the part by cutting up the part extensively. The method shown in FIG. 5 seeks to substitute non-destructive inspection for destructive inspection. To do this, one needs to establish correlation between the non-destructive inspection prediction of internal part quality and the results from destructive inspection (e.g., optical cross section measurements). After an acceptable correlation between the two methods has been established, destructive inspection can be eliminated or the number of optical cross sections required can be greatly reduced.

Figure 5:
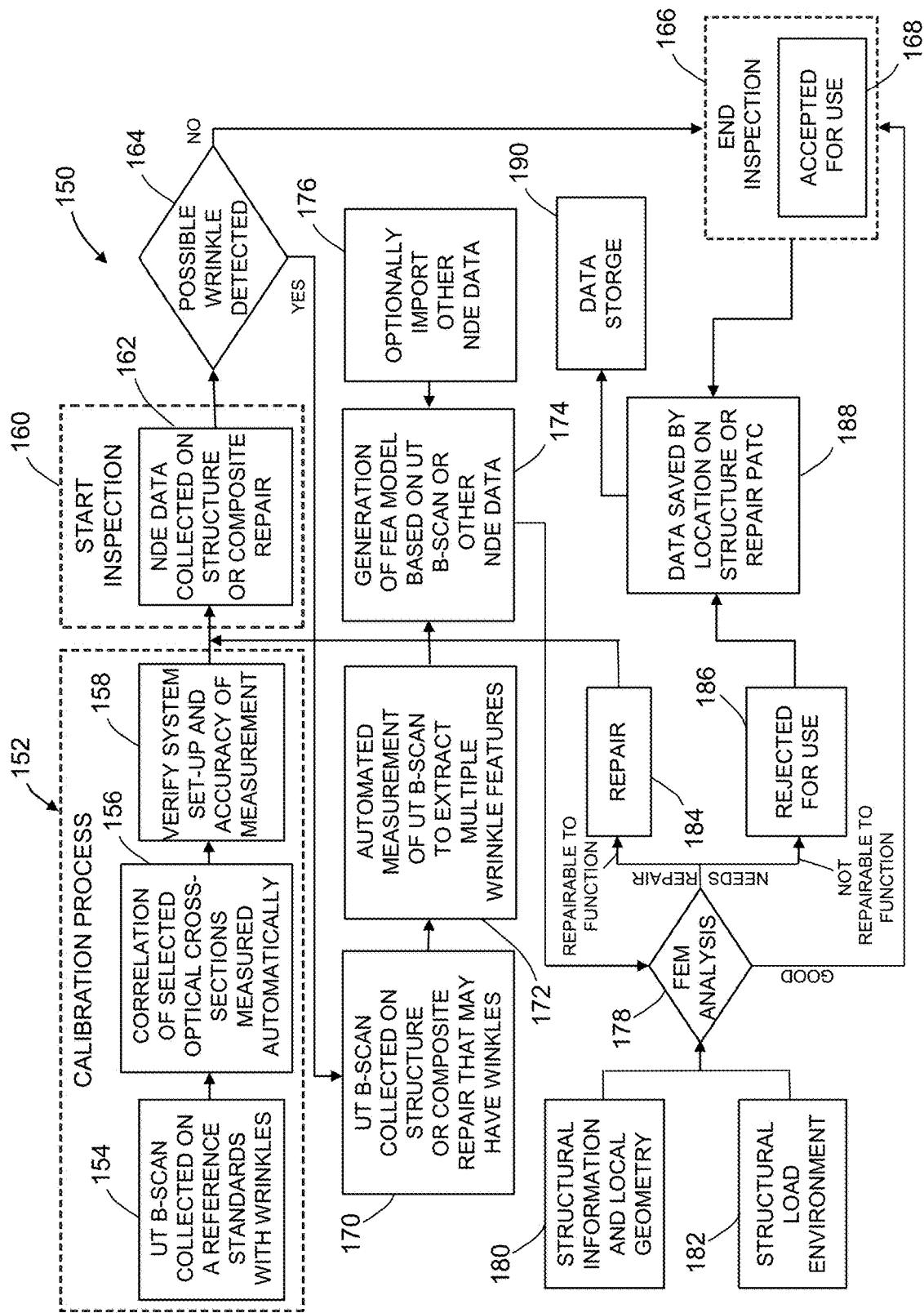
FIG. 5 is a flowchart identifying steps of a method for characterizing wrinkles in a composite structure and then predicting the performance of the wrinkled composite structure in accordance with one embodiment.

FIG. 5 is a flowchart identifying steps of a method 150 for characterizing wrinkles in a composite structure and then predicting the performance of the wrinkled composite structure in accordance with one embodiment. Prior to starting non-destructive testing of composite material using an ultrasonic inspection system, the ultrasonic inspection system must be calibrated. Steps of a calibration process 152 in accordance with one embodiment are identified in FIG. 5. First, ultrasonic transducer (UT) B-scans (hereinafter "ultrasonic B-scans") are collected on a multiplicity of reference standards consisting of composite material with wrinkles (step 154). Those same reference standards are later cut to expose cross sections of the composite material with wrinkles, which cross sections are imaged using a microscope. The resulting photographs or digital images are measured using image processing software. The resulting optical cross section measurement data is then automatically correlated with the selected B-scan data corresponding to the same area where the reference standards were sectioned (step 156). The automated calibration method can entail, for example, establishing the speed of propagation of ultrasonic pulses in the composite material of the reference standards in order to correlate TOF measurements with material depths, and selecting time and depth axes ranges and time-gate settings for A-scan, B-scan, and C-scan windows. Depth is derived from the time of flight (TOF) measured between the dispatch of an ultrasonic pulse into a structure and the return of an echo pulse. If the speed of propagation of ultrasonic pulses is known for a particular inspected material, the vertical axis of the scan window can be calibrated toward particular linear depth dimensions according to the TOF of each echo pulse. Thereafter the system set-up and the accuracy of the wrinkle measurements obtained from the B-scan data are verified (step 158).

The methodology disclosed herein automates the calibration of ultrasonic inspection systems through the use of optical cross section measurement data of reference standards. By basing calibration on an optically measured reference standard, it is possible to pull more data into location-specific inspections.

The term "reference standards" should be construed broadly to include coupons or parts made for reference purposes and early production parts fabricated for evaluation. As previously noted, the typical practice is to cross section a first part produced by the production line and sometimes a second production part in order to understand manufacturing problems (this may be part of a production part verification process). However, the sectioning and micrographing is not done for parts made after that. The process disclosed herein is equally applicable early production parts.

As evident from the earlier description of FIG. 2, a B-scan is a line of A-scans closely spaced together, which are time-amplitude signals produced by the ultrasonic transducer array in response to returning ultrasonic waves impinging thereon. The B-scan can be produced by firing a linear array of ultrasonic transducers (thus producing a line of A-scans) or by moving a single transducer along a line. Moving an array while collecting scan data will produce a full set of B-scans stacked together. Typically a B-scan image displays the amplitude in grayscale, so reflections along the line of a wrinkle will indicate its shape and dimensions. This B-scan image resembles a micrograph. B-scans taken at the location of initial optical cross sections provide the correspondence between the two methods, and help establish the ultrasonic method, so future cross sections are not required in order to characterize wrinkles.

Upon completion of the calibration process 152, non-destructive inspection (NDI) of a composite structure is started (step 160). The composite structure may be a part in production or a part in service (e.g., part of an aircraft or other vehicle). The part to be inspected may have been previously repaired or not. Any NDI technique capable of detecting the presence of wrinkles in composite material can be used, such as ultrasound techniques, infrared thermography, X-ray backscatter techniques, an X-ray backscatter technique, X-ray computed tomography, X-ray laminography, etc. During the inspection, NDI data is collected from the composite structure of interest, where the NDI data can also be referred to as nondestructive examination data or nondestructive evaluation data (step 162).

In accordance with one embodiment, the NDI data is acquired using infrared thermography. An infrared camera records the surface temperature as an applied heat pulse diffuses into the surface of the part. The image acquisition time is adjusted to match the thickness and thermal properties of the material under test. The infrared imaging data captured by the infrared camera can be processed to detect internal defects, particularly wrinkles, in composite structures. Known infrared thermographic techniques can be used to identify the presence of a wrinkle using thermal signatures. Temperature versus time profiles for all pixels in the field of view are calculated, enabling thermal signatures to be produced. By comparing the thermal signature of the part under test with the thermal signature of a reference representing a similar part having wrinkles, the presence of wrinkles can be detected. For example, the thermal signature may be based on a logarithmic first derivative of temperature versus time (i.e., $d[\ln(T)]/d[\ln(t)]$) for each pixel in a selected area on the surface of the part. In accordance with some embodiments, the thermal images are enhanced by viewing an image created by intensities related to the second derivative (i.e., $d^2[\ln(T)]/d^2[\ln(t)]$) and applying a high-pass filter to the image.

In accordance with the embodiments depicted in FIG. 5, step 160 does not involve the collection of ultrasonic B-scan data (as explained below, ultrasonic B-scan data may be collected in a later step). However, in accordance with an alternative embodiment, step 160 comprises the collection of ultrasonic B-scan data, in which case the later collection of ultrasonic B-scan data (see step 170 in FIG. 5) from the same composite structure would be superfluous.

After data collection, a determination is made whether the collected NDI data is indicative of the possible presence of a wrinkle in the composite structure or not (step 164). For example, when the NDI scan is complete, an NDI technician at the inspection site can save and transfer the NDI scan data to a remote command workstation for image processing and analysis by an NDI expert. The remote command workstation comprises a computer and a display device connected to the computer. The computer is configured to generate images of the inspected part for display on a screen of the display device by converting scan data into image data. After viewing the images of the inspected part, the NDI expert may determine that a wrinkle is possibly present in the inspected part. Alternatively, the computer may be configured to execute an algorithm that determines the probability that a wrinkle is present and then compares that probability to a specified threshold. In one exemplary implementation, if the probability is greater than zero, then a determination is made that a possible wrinkle has been detected.

In accordance with the method 150 represented by the flowchart of FIG. 5, if a determination is made in step 164 that the NDI data does not indicate the possible presence of a wrinkle in the composite structure, the inspection is ended (step 166) and the part is accepted for use (step 168). On the other hand, if a determination is made in step 164 that a wrinkle is possibly present (and if the NDI data collection step 160 did not involve the collection of ultrasonic B-scan data), then ultrasonic B-scan data is collected (step 170) from the composite structure that was inspected in step 160. The computer is configured to execute an algorithm that measures various dimensions of the wrinkle or wrinkles based on the ultrasonic B-scan data (step 172). Such wrinkle dimensions include wavelength L, maximum depth D, laminate thickness T, and thickness t of the material covered by the wrinkle. These wrinkles features are extracted by the computer automatically or in response to the NDI expert initiating the measurement process. The measurement algorithm calculates the dimensions of the wrinkle based on the B-scan data taking into account correlation of B-scan data to optical cross section measurement data established during calibration process 152.

Although not indicated in FIG. 5, method 150 may optionally include periodic verification of the accuracy of the B-scan data by cutting the scanned part to expose cross sections of the composite material with wrinkles, which cross sections are imaged using a microscope. The resulting photographs or digital images are measured using image processing software. The resulting optical cross section measurement data is then automatically correlated with the selected B-scan data corresponding to the same area where the scanned part was sectioned.

The next stage of method 150 is to predict the performance of the wrinkled composite structure based on the wrinkle feature measurements. Using the available NDI data, the wrinkle defect is modeled into a finite element mesh (step 174). More specifically, a finite element analysis (FEA) model is generated based on either the wrinkle features measured in step 172 or based on other NDI data imported in step 176. As previously mentioned, the other NDI data may be acquired using other ultrasound techniques (such as simultaneous off-angle reception), infrared thermography, X-ray backscatter techniques, X-ray computed tomography, X-ray laminography, etc.

Finite element analysis is the practice of simulating an object using similarly shaped elements. A finite element model (FEM) is composed of volumetric elements, such as tetrahedra, each having associated parameters and equations of motion. A group of elements and their parameters are used to describe a system of equations to be solved. In the present application, the finite element model may include data indicating the presence of multiple wrinkles, the proximity of any wrinkle to other structure, features or flaws, unusual shapes of the wrinkles, etc.

After the finite element model of the wrinkled region has been generated (step 174), that model is subjected to automated structural analysis, e.g., finite element model analysis 178. For example, the finite element model may be subjected to boundary conditions 180 such as structural information and local geometry and loads of a structural load environment 182 to produce a strain field, which can be analyzed. If the anomalies in the NDI data represent wrinkle features, the finite element model analysis 178 can be used to determine the residual strength of the wrinkled structure.

In one particular embodiment, the finite element model generation and analysis steps employ portions of the MATLAB®, code provided by Alberty et al. in "Matlab Implementation of the Finite Element Method in Elasticity," Computing, Vol. 69 (2002), pp. 239-263, and a mesh generator described in by Persson et al. in "A Simple Mesh Generator in Matlab", SIAM Rev., Vol. 46, No. 2 (2006), pp. 329-345. Some of the subroutines used in the process are MATLAB functions either from standard MATLAB or from MATLAB's Image Processing toolbox. Meshgrid, distmesh2D, and fixmesh are subroutines that create a finite element mesh, and fem_lame2D analyzes the mesh.

In some embodiments the output of the finite element model analysis 178 may be compared to or correlated with allowed damage. The allowed damage may be developed using a damage tolerance analysis. The allowable output by the damage tolerance analysis may be input to the finite element model analysis 178. The comparison could take a variety of forms. For example, a scalar maximum strain value could be calculated from the analysis and compared to a single allowable strain number from a design manual, a design guide, or a table created by previous test results and statistical analysis.

With allowable damage limits established, decisions about the health of the structure can now be made based on the relative magnitude of the ultimate strength of the pre-anomaly structure and the ultimate strength as predicted by the post-anomaly stress analysis. In some embodiments a good/not good decision regarding the continued use of the structure or component may be made as part of the finite element model analysis 178. As a decision aid, a graphical representation of the acceptability of the structure, and the resulting effect on future use, may be produced and output in some embodiments.

If the results of the finite element model analysis 178 indicate that the predicted health of the wrinkled part is good, e.g., has a strength parameter greater than a pre-set criterion (which is predetermined by allowables/models), such as a minimum allowable strength, the inspection is ended (step 166) and the part is accepted for use as is (step 168). If the results of the finite element model analysis 178 indicate that the predicted health of the simulated wrinkled part is not good, e.g., has a strength parameter less than the pre-set criterion, then a determination is made (as part of the FEM analysis) whether the wrinkled part is repairable to function or not.

If the wrinkled part is predicted to be repairable to function, then the wrinkled part is repaired (step 184). Upon completion of the repair, the repaired structure may undergo inspection and analysis in the manner previously described by returning to step 162.

If the wrinkled part is predicted to be not repairable to function, then the wrinkled part is rejected for use (step 186). All inspection, image processing, modeling and analysis data and the performance prediction associated with the rejected part are saved as a function of location on the composite structure or repair patch (step 188) in data storage 190 for use in-service if damage occurs in the future. The data storage 190 is a non-transitory tangible computer-readable storage medium. All wrinkle data is used for analytic purposes, and fed back into tool and process changes before sub-rejectable wrinkles get worse. Two examples are if there is inadequate compaction of the composite structure or repair patch due to tooling or incorrect curing (temperature and pressure) of the composite material. Changes could be made to the tooling or adjustments to the cure cycle of the composite to reduce the occurrence of wrinkles.

In accordance with some embodiments, a wrinkle defect is modeled into a finite element mesh using the NDI data. Either an idealized or accurate representation of the wrinkle geometry can be achieved.

Figure 6:
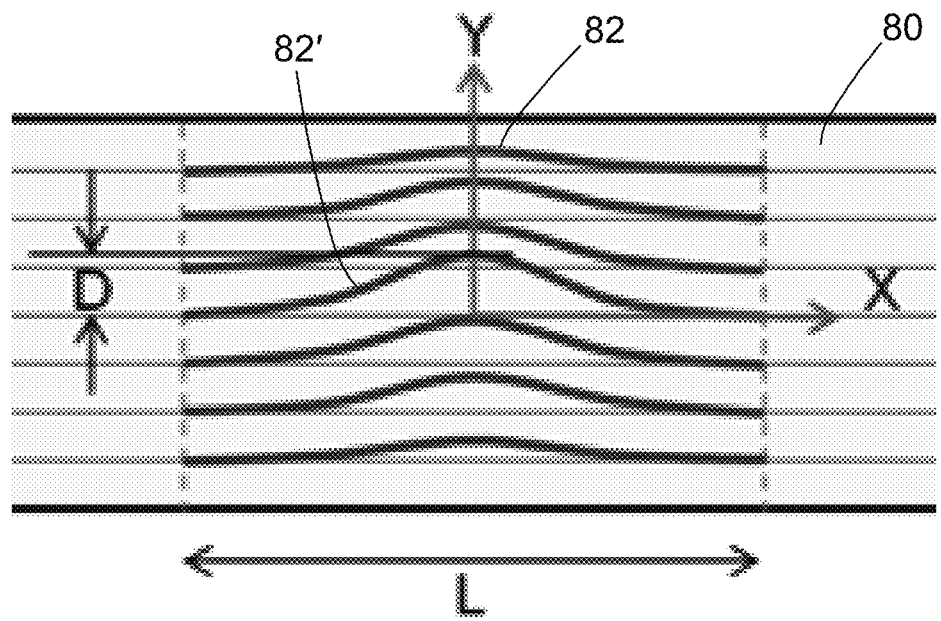
FIG. 6 is a diagram representing an idealized wrinkle profile in a composite laminate comprising a multiplicity of plies.

FIG. 6 is a diagram representing an idealized wrinkle profile in a composite laminate comprising a multiplicity of plies 80. This idealized wrinkle profile includes a multiplicity of trace lines 82 that represent ply boundaries. The trace line 82' traces out a simple cosine function that is based on the wavelength L and maximum depth D of the wrinkle as measured in step 172 (see FIG. 5). In accordance with one embodiment, the profile can be represented by the following equations:

$$y'(x, y) = y + \frac{h}{2}\left[1 + \cos\left(\frac{2\pi x}{L}\right)\right]$$

-continued
$$h = D\left[1 - \left|\frac{2y}{T}\right|\right]$$

where T is the total thickness of the laminate.

Figure 7:
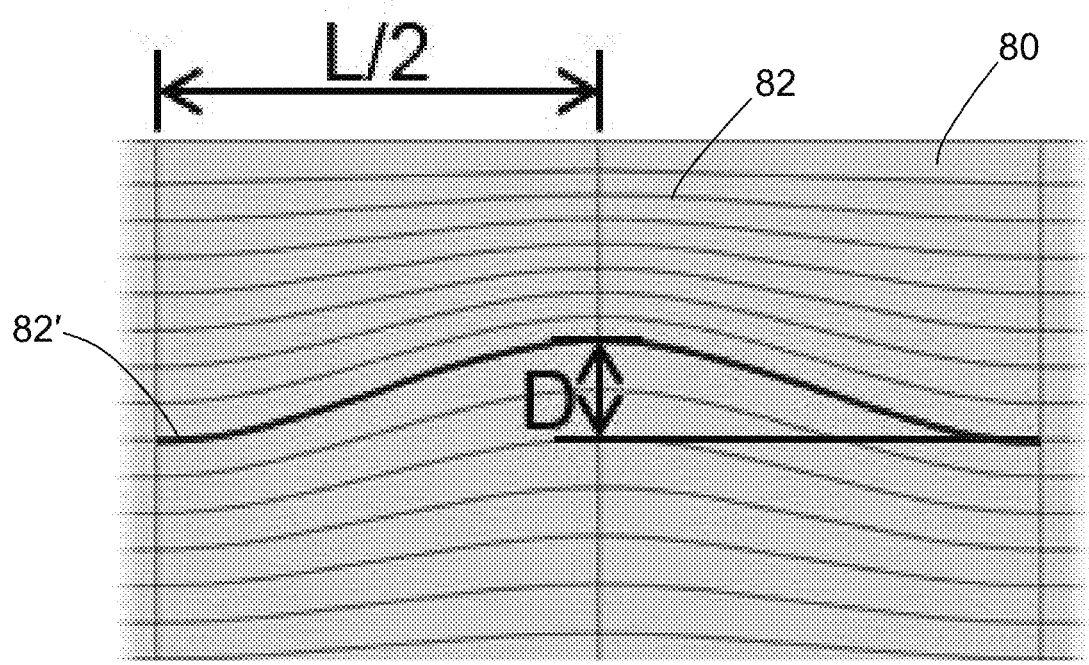
FIG. 7 is a diagram representing a sectional view taken from a three-dimensional finite element model that is based on the idealized wrinkle profile depicted in FIG. 6.

FIG. 7 is a diagram representing a sectional view taken from a three-dimensional finite element model that is based on the idealized wrinkle profile depicted in FIG. 6. This finite element model depicts a multiplicity of partitioned individual plies 80. The ply orientations follow the ply boundaries indicated by lines 82. The line 82' represents the ply boundary having wavelength L and maximum depth D.

In the alternative, an accurate wrinkle profile can be generated using information from an ultrasonic B-scan or other NDI data to more accurately trace out the profile of a wrinkle. More specifically, ply boundaries in the wrinkled composite structure can be traced from a micrograph or B-scan image using a MATLAB image processing algorithm.

Figure 8:
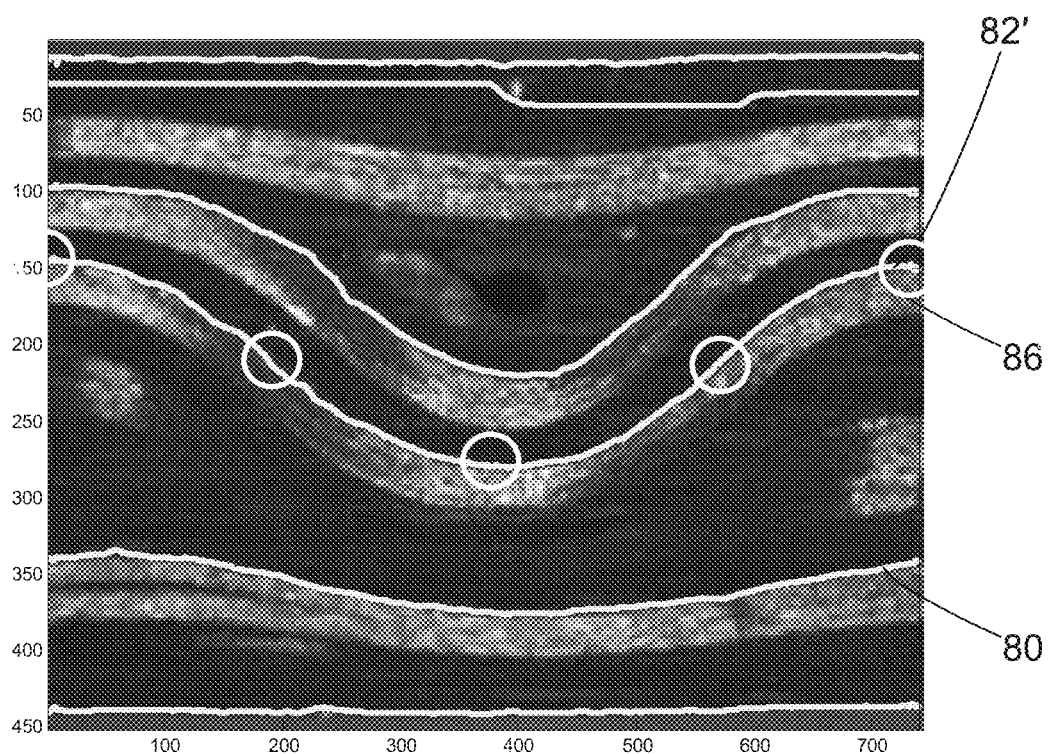
FIG. 8 is a diagram representing a micrograph of a composite structure comprising a multiplicity of plies and having trace lines superimposed on respective ply boundaries, including a trace line superimposed on the ply boundary having maximum depth.

FIG. 8 is a diagram representing a micrograph of a composite structure comprising a multiplicity of plies 80 and having trace lines 82 superimposed on respective ply boundaries, including a trace line 82' superimposed on the ply boundary having maximum depth. As part of the process for generating an accurate wrinkle profile, five boundary points are selected along each trace line. In FIG. 8, five boundary points 86 (indicated by respective circles) have centers that lie along trace line 82'. These boundary points 86 can be selected by the user or by an algorithm executed by a computer. Each selected boundary point has (x, y) coordinates which define the location of the ply boundaries in the displayed image. A script run by the computer reads in these boundary points and uses a spline fit technique to generate a finite element model representing the geometry of the wrinkled composite structure.

Figure 9:
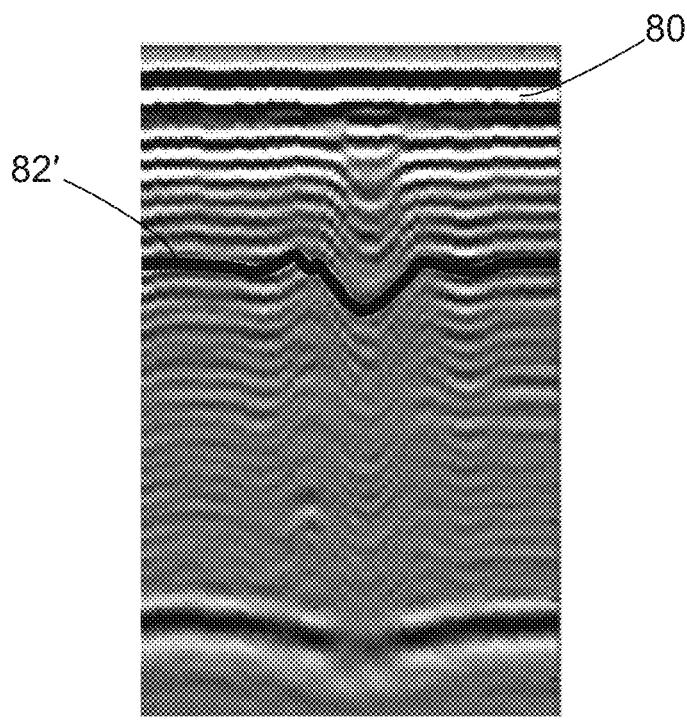
FIG. 9 is a diagram representing a B-scan image of a composite structure comprising a multiplicity of plies and having a trace line superimposed on the ply boundary with maximum depth.

FIG. 9 is a diagram representing a B-scan image of a composite structure comprising a multiplicity of plies 80 and having a trace line 82' superimposed on the ply boundary with maximum depth. The same boundary point selection process described in the preceding paragraph can be applied to generate a finite element model representing the geometry of the wrinkled composite structure.

Figure 10:
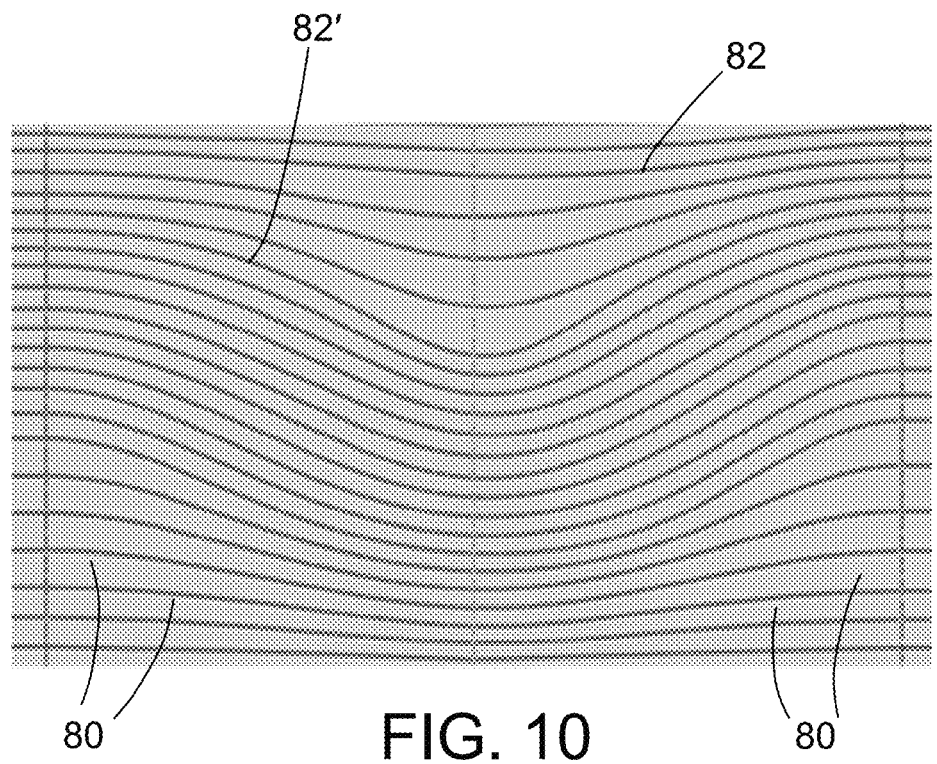
FIG. 10 is a diagram representing a sectional view taken from a three-dimensional finite element model that is based on the accurate wrinkle profile depicted in FIG. 8.

FIG. 10 is a diagram representing a sectional view taken from a three-dimensional finite element model that is based on the accurate wrinkle profile depicted in FIG. 8. This finite element model depicts a multiplicity of partitioned individual plies 80. The ply orientations follow the ply boundaries indicated by lines 82. The line 82' represents the ply boundary having wavelength L and maximum depth D.

Figure 11:
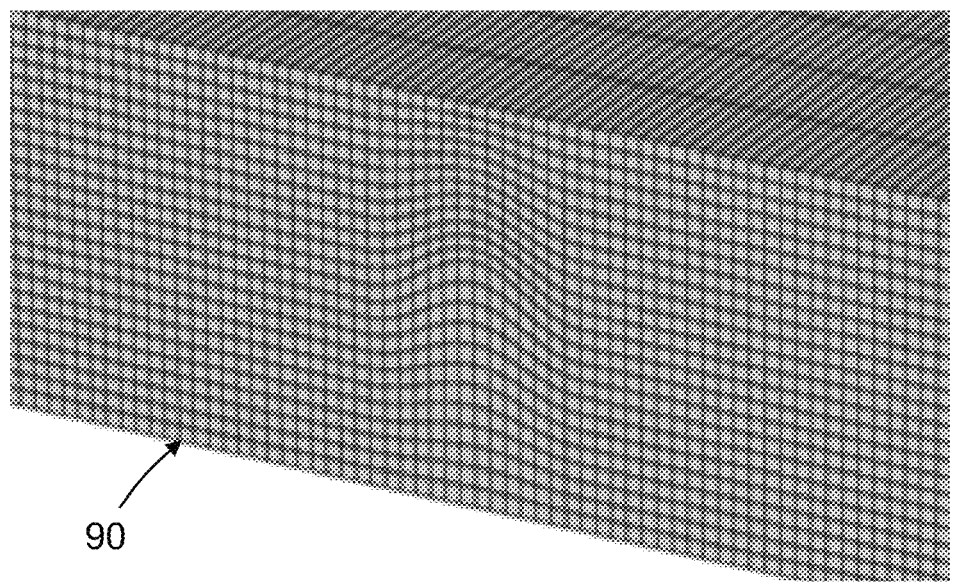
FIG. 11 is a diagram representing a portion of a typical three-dimensional finite element model of a wrinkled laminated coupon having a wrinkled profile.

FIG. 11 is a diagram representing a portion 90 of a typical three-dimensional finite element model of a wrinkled laminated coupon having a wrinkled profile. The wrinkled finite element model is analyzed to better understand the knockdown associated with the wrinkle defect. Analytical techniques like progressive failure analysis can be used to achieve improved simulation correlation and structural performance knockdown understanding. Coupon or subcomponent level models can be analyzed, depending on the desired structural design and loading environment evaluation. Material properties of composite materials may be determined using standardized methodologies. For example, the ASTM D695-10 standard describes a methodology for testing the compressive property of rigid plastics. Advances in software-based tools, such as progressive failure analysis tools to predict structural failure of laminated composite parts, have enabled replacing expensive tests with simulations.

Figure 12:
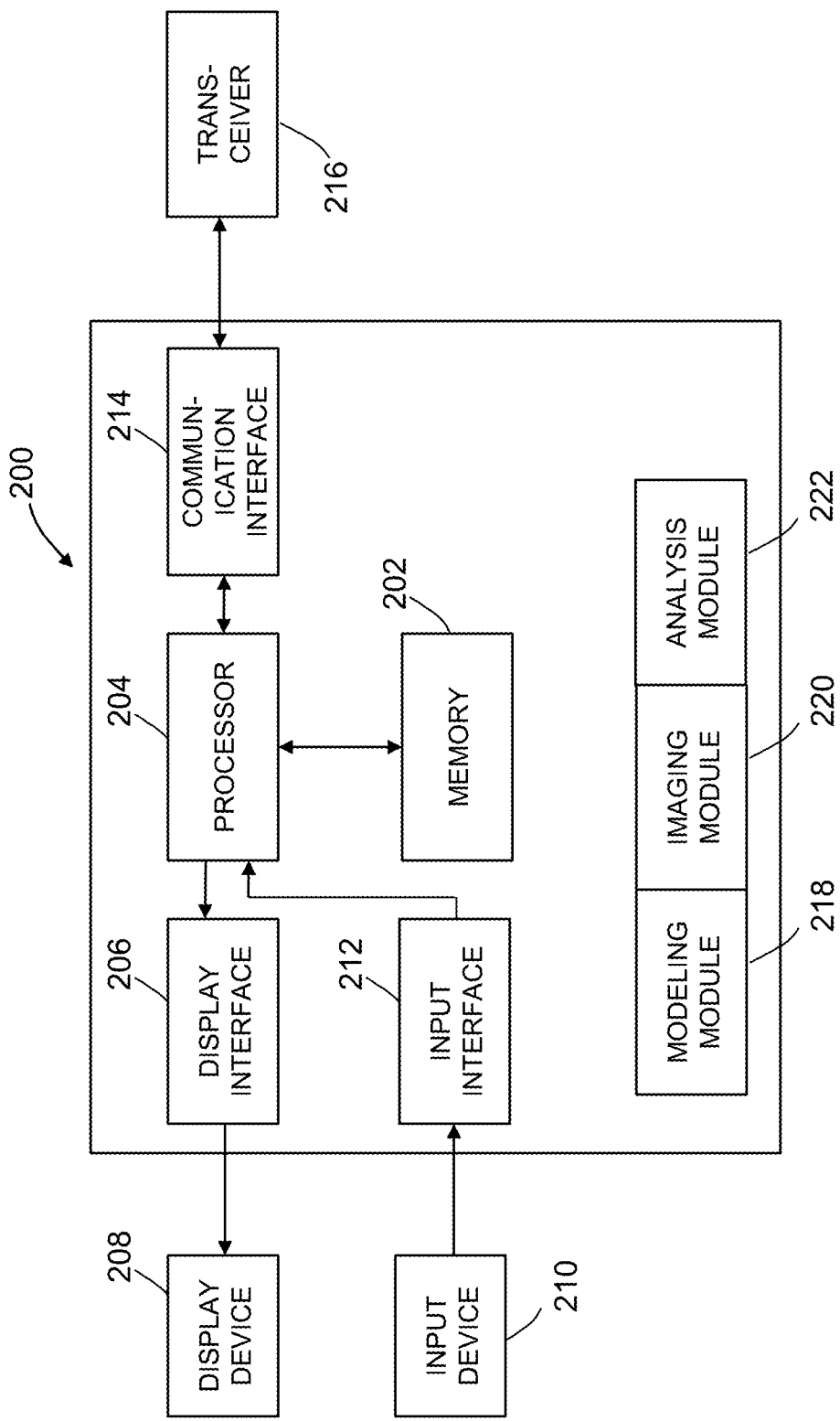
FIG. 12 is a block diagram identifying components of a computer system suitable for executing automated data processing functions that predict the performance of a wrinkled composite structure.

FIG. 12 is a block diagram identifying components of a computer system 200 suitable for executing automated data processing functions adapted to predict the performance of a wrinkled composite structure. In accordance with one embodiment, computer system 200 comprises a memory device 202 and a processor 204 coupled to memory device 202 for use in executing instructions. More specifically, computer system 200 is configurable to perform one or more operations described herein by programming memory device 202 and/or processor 204. For example, processor 204 may be programmed by encoding an operation as one or more executable instructions and by providing the executable instructions in memory device 202.

Processor 204 may include one or more processing units (e.g., in a multi-core configuration). As used herein, the term "processor" is not limited to integrated circuits referred to in the art as a computer, but rather broadly refers to a controller, a microcontroller, a microcomputer, a programmable logic controller, an application specific integrated circuit, and other programmable circuits.

In the exemplary embodiment, memory device 202 includes one or more devices (not shown) that enable information such as executable instructions and/or other data to be selectively stored and retrieved. In the exemplary embodiment, such data may include, but is not limited to, properties of composite materials, properties of ultrasonic waves, modeling data, imaging data, calibration curves, operational data, and/or control algorithms. In the exemplary embodiment, computer system 200 is configured to automatically implement a parametric finite element analysis to determine a desired evaluation setting for use in inspecting a wrinkled composite structure. Alternatively, computer system 200 may use any algorithm and/or method that enables the methods and systems to function as described herein. Memory device 202 may also include one or more non-transitory tangible computer-readable storage media, such as, without limitation, dynamic random access memory, static random access memory, a solid state disk, and/or a hard disk.

In the exemplary embodiment, computer system 200 further comprises a display interface 206 that is coupled to processor 204 for use in presenting information to a user. For example, display interface 206 may include a display adapter (not shown) that may couple to a display device 208, such as, without limitation, a cathode ray tube, a liquid crystal display, a light-emitting diode (LED) display, an organic LED display, an "electronic ink" display, and/or a printer.

Computer system 200, in the exemplary embodiment, further comprises an input interface 212 for receiving input from the user. For example, in the exemplary embodiment, input interface 212 receives information from an input device 210 suitable for use with the methods described herein. Input interface 212 is coupled to processor 204 and to input device 210, which may include, for example, a joystick, a keyboard, a pointing device, a mouse, a stylus, a touch sensitive panel (e.g., a touch pad or a touch screen), and/or a position detector.

In the exemplary embodiment, computer system 200 further comprises a communication interface 214 that is coupled to processor 204. In the exemplary embodiment, communication interface 214 communicates with at least one remote device, e.g., a transceiver 216. For example, communication interface 214 may use, without limitation, a wired network adapter, a wireless network adapter, and/or a mobile telecommunications adapter. A network (not shown) used to couple computer system 200 to the remote device may include, without limitation, the Internet, a local area network (LAN), a wide area network, a wireless LAN, a mesh network, and/or a virtual private network or other suitable communication means.

In the exemplary embodiment, computer system 200 further comprises at least a modeling module 218, an imaging module 220, and an analysis module 222 that enable the methods and systems to function as described herein. These modules may take the form of software comprising code executed by the processor 204. In the exemplary embodiment, modeling module 218 is configured to generate finite element models of the wrinkled composite structure; imaging module 220 is configured to produce and process images such as micrographs and B-scan images; and analysis module 222 is configured to perform a FEM failure analysis of the finite element model by applying boundary conditions and loads.

While methods for wrinkle characterization and performance prediction for composite structures have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The method claims set forth hereinafter should not be construed to require that the steps recited therein be performed in alphabetical order (alphabetical ordering in the claims is used solely for the purpose of referencing previously recited steps) or in the order in which they are recited. Nor should they be construed to exclude two or more steps or portions thereof being performed concurrently or to exclude any portions of two or more steps being performed alternatingly.

The invention claimed is:

1. A method for calibrating an ultrasonic inspection system, comprising:
   (a) forming a multiplicity of reference standards made of composite material, each reference standard having at least one wrinkle;
   (b) collecting ultrasonic B-scan data from the multiplicity of reference standards in respective areas using an ultrasonic inspection system;
   (c) cutting the reference standards in the respective areas to expose respective cross sections;
   (d) imaging the exposed cross sections to produce a respective optical cross section for each reference standard;
   (e) measuring features of the at least one wrinkle of each reference standard which appear in the optical cross sections to acquire optical cross-section measurement data;
   (f) for each reference standard, correlating the ultrasonic B-scan data collected in the respective area where the reference standard was cut with the optical cross-section measurement data acquired from the respective optical cross section to produce a respective wrinkle profile characterization for each reference standard; and
   (g) using a computer to calculate dimensions of the wrinkle based on the ultrasonic B-scan data taking into account the correlation of the ultrasonic B-scan data to optical cross section measurement data established in step (f).

2. The method as recited in claim 1, wherein the optical cross-section measurement data comprises data representing wavelengths and maximum depths of wrinkles in respective reference standards of the multiplicity of reference standards.

3. The method as recited in claim 2, wherein the optical cross-section measurement data further comprises data representing thicknesses of the respective reference standards.

4. The method as recited in claim 3, wherein step (f) comprises correlating time-of-flight measurements with material depths.

5. The method as recited in claim 4, further comprising selecting time and depth axes ranges and time-gate settings for a B-scan window based on results of step (f), including the correlating of the time-of-flight measurements with the material depths.

6. An ultrasonic imaging system having a B-scanning mode in which time and depth axes ranges and time-gate settings for a B-scan window are based on a correlation of ultrasonic B-scan data acquired in an area of a reference standard made of composite material with optical cross-section measurement data acquired from an image of a cross section of the reference standard made by cutting the area where the ultrasonic B-scan data was acquired.

7. The ultrasonic imaging system as recited in claim 6, wherein the optical cross-section measurement data comprises data representing wavelengths and maximum depths of wrinkles in respective reference standards.

8. The ultrasonic imaging system as recited in claim 7, wherein the optical cross-section measurement data further comprises data representing thicknesses of the respective reference standards.

9. A method for non-destructive inspection of composite structures, comprising:
  (a) calibrating an ultrasonic inspection system based on a correlation of ultrasonic B-scan data acquired in an area of a reference standard made of composite material with optical cross-section measurement data acquired from an image of a cross section of the reference standard made by cutting the area where the ultrasonic B-scan data was acquired, each reference standard having at least one wrinkle;
  (b) collecting non-destructive inspection data from a part made of composite material using the ultrasonic inspection system after completion of step (a);
  (c) detecting the presence of a wrinkle in the part based on the non-destructive inspection data collected in step (b);
  (d) collecting ultrasonic B-scan data from the part using the ultrasonic inspection system; and
  (e) calculating dimensions of the wrinkle in the part based on the ultrasonic B-scan data collected in step (d) using a computer that takes into account the correlation of the ultrasonic B-scan data with the optical cross section measurement data.

10. The method as recited in claim 9, wherein the non-destructive inspection data is collected in step (b) using at least one of the following: an ultrasound technique, infrared thermography, or an X-ray backscatter technique.

11. The method as recited in claim 9, further comprising generating a structural model of the part and performing a structural analysis of the structural model.

12. The method as recited in claim 11, further comprising determining whether the part should be rejected or not based on results of the structural analysis.

13. The method as recited in claim 11, wherein the structural model is a finite element model and the structural analysis is a finite element model analysis.

14. A method for non-destructive inspection of composite structures, comprising:
  (a) calibrating an ultrasonic inspection system based on a correlation of ultrasonic B-scan data acquired in an area of a reference standard made of composite material with optical cross-section measurement data acquired from an image of a cross section of the reference standard made by cutting the area where the ultrasonic B-scan data was acquired, each reference standard having at least one wrinkle;
  (b) collecting ultrasonic B-scan data from a part made of composite material using the ultrasonic inspection system after completion of step (a);
  (c) detecting the presence of a wrinkle in the part based on the ultrasonic B-scan data collected in step (b); and
  (d) calculating dimensions of the wrinkle in the part based on the ultrasonic B-scan data collected in step (b) using a computer that takes into account the correlation of the ultrasonic B-scan data with the optical cross section measurement data.

15. The method as recited in claim 14, further comprising generating a structural model of the part and performing a structural analysis of the structural model.

16. The method as recited in claim 15, further comprising determining whether the part should be rejected or not based on results of the structural analysis.

17. The method as recited in claim 15, wherein the structural model is a finite element model and the structural analysis is a finite element model analysis.

18. A method for predicting performance of a wrinkled composite structure, comprising:
  (a) calibrating an ultrasonic inspection system based on a correlation of ultrasonic B-scan data acquired in an area of a reference standard made of composite material with optical cross-section measurement data acquired from an image of a cross section of the reference standard made by cutting the area where the ultrasonic B-scan data was acquired, each reference standard having at least one wrinkle;
  (b) collecting ultrasonic B-scan data from a wrinkled composite structure using the ultrasonic inspection system after completion of step (a);
  (c) calculating dimensions of a wrinkle in the wrinkled composite structure based on the ultrasonic B-scan data collected in step (b) using a computer that takes into account the correlation of the ultrasonic B-scan data with the optical cross section measurement data to obtain wrinkle feature measurements;
  (d) generating a structural model of the wrinkled composite structure based on the wrinkle feature measurements obtained in step (c); and
  (e) performing a structural analysis of the structural model.

19. The method as recited in claim 18, further comprising determining whether the wrinkled composite structure should be rejected or not based on results of the structural analysis.

20. The method as recited in claim 18, wherein the structural model is a finite element model and the structural analysis is a finite element model analysis.

* * * * *